United States Patent [19]
Epstein et al.

[11] Patent Number: 5,824,371
[45] Date of Patent: Oct. 20, 1998

[54] CORROSION RESISTANT METAL ARTICLE COATED WITH EMERALDINE BASE POLYANILINE

[75] Inventors: Arthur J. Epstein, Bexley; Shashi G. Jasty, Columbus, both of Ohio

[73] Assignee: Ohio State University Research Foundation, Columbus, Ohio

[21] Appl. No.: 383,346

[22] Filed: Feb. 3, 1995

[51] Int. Cl.$^6$ ....................................................... B05D 7/14
[52] U.S. Cl. .................... 427/388.1; 428/457; 427/388.2
[58] Field of Search .......................... 428/457; 427/388.1, 427/388.2

[56] References Cited

U.S. PATENT DOCUMENTS 5,441,772  8/1995  McAndrew et al. ................... 427/388.1

FOREIGN PATENT DOCUMENTS 1321042  9/1988  Canada ............................. H01B 1/12
2000431  4/1990  Canada .
WO93/14166  7/1993  WIPO ............................... C09D 5/08

OTHER PUBLICATIONS

Ahmad et al., "Inhibition of Corrosions of Steels by Conducting Polymers", Session FF10, Bulletin of the American Physical Society, vol. 32, No. 3, Mar. 1987, p. 548.

G. Mengoli et al., "Anodic Synthesis of Polyaniline Coatings onto Fe Sheets", Journal of Applied Polymer Science, vol. 26, 4247–4257 (1981).

N. Ahmad et al., "Inhibition of Corrosion of Steels by Conducting Polymers", Session FF10, Bulletin of the American Physical Society, vol. 32, No. 3, Mar., 1987, p. 548.

A.G. MacDiarmid et al., "Synthetic Metals: A Novel Role for Organic Polymers", Techincal Report No.: 1911–5, Office of Naval Research, Apr. 3, 1991.

D.W. DeBerry, "Modification of the Electrochemical and Corrosion Behavior of Stainless Steel with an Electroactive Coating", Journal of the Electrochemical Society: Electrochemical Science and Technology, May 1985, vol. 132, pp. 1022–1026.

G. Troch–Nagels et al., "Electron Conducting Orgnaic Coating of Mild Steel by Electropolymerization", Journal of Applied Electrochemistry 22 (1992) 756–764.

D.A. Wrobleski et al., "Corrosion Resistant Coatings from Conducting Polymers", Polymer Preprints, vol. 35, No. 1, Mar. 1994, pp. 265–266.

B. Wessling, "Passivation of Metals by Coating with Polyaniline: Corrosion Potential Shift and Morphological Changes", Advanced Materials, Communications, vol. 6, No. 3, pp. 226–228 (1994).

*Primary Examiner*—Edward J. Cain
*Attorney, Agent, or Firm*—Richard P. Fennelly; Louis A. Morris

[57] ABSTRACT

The present invention relates to a corrosion resistant metal article which comprises: (a) a metal body normally prone to corrosion when subjected to potentially corrosive conditions; and (b) a coating of neutral, undoped polyaniline in the emeraldine base form on a portion of the metal body (e.g., a side coating or undercoating) of the neutral, undoped polyaniline in the emeraldine base form on the metal body, where the distance (for example, not more than about one centimeter) between coated and uncoated portions of the metal is effective to protect the uncoated portion of the metal as well as the coated portion.

12 Claims, 8 Drawing Sheets

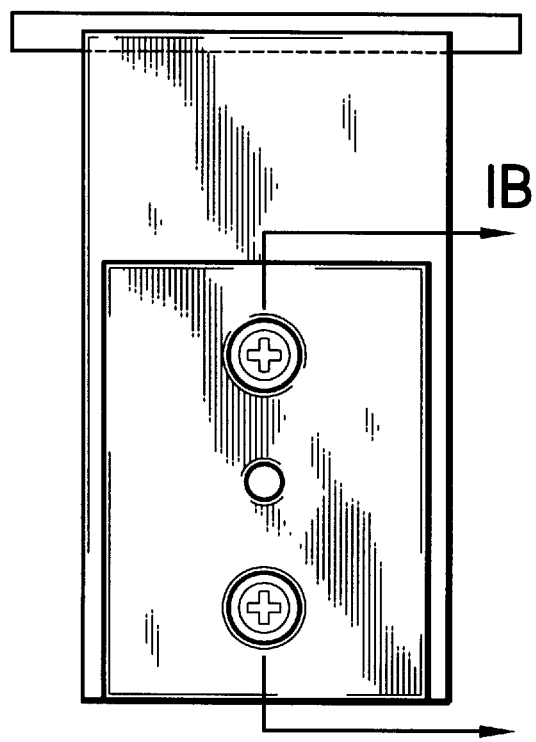
FIG. IA
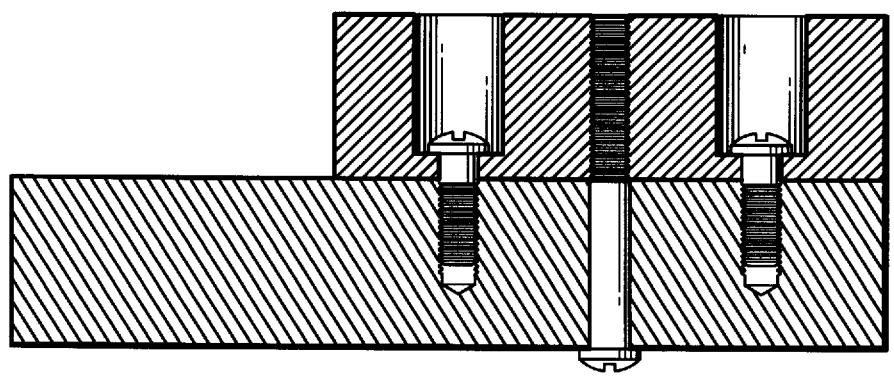
FIG. IB

CORROSION RESISTANT METAL ARTICLE COATED WITH EMERALDINE BASE POLYANILINE

BACKGROUND OF THE INVENTION

There have been a series of reports in the scientific literature during the last decade on the corrosion protection offered by polyaniline when coated onto a metal surface that is normally prone to corrosion upon exposure to conditions which can give rise to corrosion. G. Mengoli et al., Journal of Applied Polymer Science, Vol. 26, 4247–4257 (1981) reported the anodic synthesis of polyaniline coatings onto iron sheets. D.W. DeBerry, in Journal of the Electrochemical Society: Electrochemical Science and Technology, May 1985, pp. 1022–1026 electrochemically deposited polyaniline onto stainless steel and concluded that a polyaniline emeraldine salt coating appeared to be deposited over a native passive metal oxide film which was said to be maintained by doped polyaniline. Los Alamos National Laboratory scientists (see ACS Polymer Preprints, Vol. 35, 265, March, 1994) have utilized a doped form of polyaniline as a primer coat with a topcoat of either epoxy or polyurethane, while Wessling and coworkers (see, for example, Adv. Mater. Vol. 6, 226, 1994) have utilized a proprietary partially doped form of polyaniline (VERSICON brand from Allied-Signal) in treating metal surfaces.

Recent PCT International Patent Publication No. WO 93/14166 teaches that metals can be coated with a paint containing a binder and polyaniline dispersed in a liquid medium.

A. G. MacDiarmid and coworkers have indicated that the emeraldine state of the polyaniline had been used to coat steel which was said to be "similar" to stainless steel, which is known to persons of ordinary skill in the art to not be normally prone to corrosion, without any discussion of the results obtained in regard to corrosion protection of the metal (N. Ahmad et al., Bull. of the Amer. Phys. Soc., Program of the March 16–20, 1987 Meeting, Vol. 32, No. 3, p. 548, Abstract FF10) . These investigators had also earlier indicated that removal of the p-doped (partially oxidized) form of "certain conducting polymers" had a potential suitable in principle for the anodic passivation of "certain" steels including areas from which such partially doped materials had been removed.

SUMMARY OF THE INVENTION

The present invention relates to a corrosion resistant metal article which comprises: (a) a metal body normally prone to corrosion when subjected to potentially corrosive conditions; and (b) a coating, such as a side coating or other-sided coating (e.g., undercoating), of neutral, undoped polyaniline in the emeraldine base form on a portion of the metal body, where the distance, for example, not more than about one centimeter, between coated and uncoated portions of the metal is effective to protect the uncoated portion of the metal as well as any polyaniline-covered portion of the metal.

DESCRIPTION OF THE DRAWINGS

The present invention can be further understood by reference to the Drawings which form a portion of the present specification wherein:

FIG. 1A and 1B are schematic views of the sample holder in a Veeco MicroEtch ion mill;

DESCRIPTION OF PREFERRED EMBODIMENTS

Figure 1:
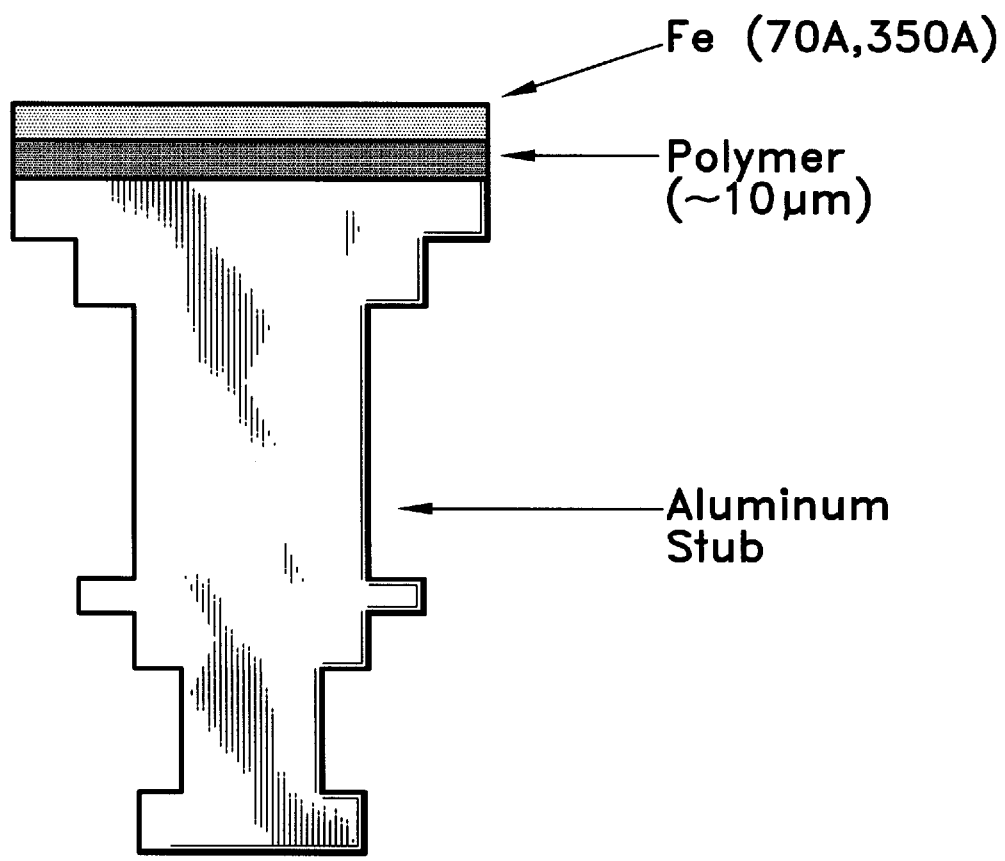
FIG. 1 is a schematic, cross-sectional view of the iron/polymer sample configuration, which is not drawn to scale, for examination by X-ray photoelectron spectroscopy (XPS)

As described before, the present invention, in its broadest embodiment, relates to a corrosion resistant metal article which comprises: (a) a metal body normally prone to corrosion when subjected to potentially corrosive conditions; and (b) a coating of neutral, undoped polyaniline in the emeraldine base form on a portion of the metal body, where the distance between coated and uncoated portions of the metal is effective to protect the uncoated portion of the metal as well as any polyaniline-coated portion.

The present invention is useful with any metal which will be prone to undergo corrosion. In contrast to the above-described publication of N. Ahmad et al. relating to the coating of steel similar to stainless steel with the emeraldine base form of polyaniline, this invention relates to the corrosion protection of a metal body normally prone to corrosion when subjected to potentially corrosive conditions. Examples of such metals include those which are ferrous in nature, including mild steel, which can be viewed as a "compound" metal comprising iron and a small amount of carbon. The term "compound metal" as used herein is intended to be synonymous with the term "alloy". Another metal which can be treated in accordance with the present invention is copper, such as used in electronic applications. Other metals which can be coated include steel alloys, aluminum, aluminum alloys, and other non-noble metals. The thickness of the metal can range from about 10 Angstroms to about one centimeter.

The polyaniline material which is used in accordance with the present invention is the well-known emeraldine base form of polyaniline and which can be easily formed by the oxidation of aniline in excess hydrochloric acid by ammonium persulfate followed by treatment with ammonium hydroxide as described, for example, by A. G. MacDiarmid and coworkers in Conducting Polymers (L. Alcacer, ed.), D. Reidel Publishing Co., Dordrecht, The Netherlands, 1987, p. 105–119Y. This material, which is illustrated, for example at page 10, line 11 to page 12, line 29 of PCT International Patent Publication No. WO 93/14166, will have recurring backbone monomeric units that are (1) substituted or unsubstituted phenyl rings and amine linkages (—NH— or —NR—, where R can be lower alkyl, such as methyl, ethyl, or propyl or lower alkoxy, such as methoxy, ethoxy, or propoxy) and (2) substituted or unsubstituted quinoid rings and imine (—N=) linkages. The substituents on either or both of the phenyl and quinoid rings can be the same as R as previously defined. In general, the proportion of the phenyl and amine-containing structures in the repeat unit comprising Formulae II and III, in the above-cited PCT patent reference, can range from about 0.35 to about 0.65. Oligomers starting at two repeat units up to about 1000 repeat units can be used, if desired.

The foregoing type of polyaniline material is advantageously applied to the selected metal by such means as by: brush or roller; air or airless spray; electrostatic, hot or steam spraying; aerosol spray; dip, flow or electrodeposition coating; roller coating machines; or powder coating. The coating containing the polyaniline material can also contain other, noninterfering additives, such as, dispersion liquid(s), binder(s), pigment(s), extender(s), surfactant(s), and/or thickener(s).

The coating intended herein can be an undercoating of the metal where the desired site for corrosion protection is the upper surface of the metal which lies on the opposed side of the metal body. This is one example of an "other-sided" coating as intended herein. The term "other-sided" is intended to mean coating of the polyaniline material on a surface of the metal which is on the opposed surface to that intended to be protected from corrosion. Alternatively, or in combination, the coating can be a side coating of the polyaniline where the coating is, for example, at 90° to the plane of the surface to be protected. The distance between coated and uncoated portions of the metal which is intended to be protected is effective to protect the uncoated portion of the metal as well as the coated portion. For example, in preferred embodiments this distance is generally not more than about one centimeter.

It is envisioned that one use for the present invention is to coat the type of continuous metal sheet, such as steel, used in coil coatings technology. Such a sheet can be coated, if desired, on all surfaces (top, bottom, and both thin sides) with the polyaniline so that, when the metal sheet is cut into smaller pieces, the uncoated surfaces on the cut edges will be protected by the presence of the polyaniline on the adjacent, coated surfaces. Alternatively, either the top or bottom of the sheet can be coated to achieve protection of either (or both) of the opposed side and uncoated edges.

Another use of the present invention is to undercoat the surfaces of thin copper conductive pathways in electronic devices. The undercoating will protect the opposed top surface of the metal making it unnecessary to protect such a top surface, for example, with an organic varnish which could compromise any desired metal-to-metal contact if another metal is intended to be bonded to the top surface of the copper in a more complex electronic configuration.

The present invention is further illustrated by the Examples which follow.

EXAMPLE 1

This Example illustrates the preparation of powders of emeraldine base and emeraldine hydrochloride salt forms of polyaniline.

Polyaniline was chemically synthesized, as described by A. G. MacDiarmid and coworkers in Conducting Polymers (L. Alcacer, ed.), D. Reidel Publishing Co., Dordrecht, The Netherlands, 1987, p. 105–119, in the emeraldine hydrochloride form (ES-HCl) by the oxidative polymerization of aniline using ammonium persulfate and then converted to the emeraldine base (EB) form by washing with aqueous ammonium hydroxide.

Ammonium persulfate (11.5 gm) was dissolved in 200 ml of 1M hydrochloric acid which had been precooled to between 0° C. and 5° C. Aniline (20.0 ml) was dissolved in 300 ml of 1M hydrochloric acid which had been similarly precooled. The aniline solution was placed in a 1000 ml Erlenmeyer flask with a magnetic stirring bar and the container was placed in an ice bath on a magnetic stirring plate.

The ammonium persulfate solution was added to the aniline solution, with constant stirring, over a period of one minute. The solution was then stirred in an ice bath for about one and one half hours, during which time the temperature was maintained below 5° C. Three to five minutes after the reactants were mixed, the solution started to take on a blue-green tint and then became an intense blue-green color with a coppery glint as a precipitate formed. The coppery glint was less pronounced after about one hour.

After about one and one half hours, the precipitate was collected on a Buchner funnel (diameter of 7.5 cm) using a water aspirator. The precipitate cake was washed portionwise (60 ml portions) with 1M hydrochloric acid until the initially pale violet filtrate became colorless. The liquid level was constantly adjusted so that it remained above the top of the precipitate.

This prevented cracking of the precipitate cake, which would result in inefficient washing of the precipitate. A minimum of 500 ml 1M hydrochloric acid was used. The "as-made" precipitate was polyaniline in the incompletely protonated (about 42% protonation) emeraldine hydrochloride form.

After the above washing, the precipitate remained under suction for about ten minutes until significant cracking of the moist filter cake occurred. The moist emeraldine hydrochloride cake was then suspended with constant stirring in 500 ml of 0.1M ammonium hydroxide solution. If, after ten minutes, the pH of the suspended liquid was less than 8, 1.0M ammonium hydroxide was added dropwise to bring the pH up to about 8. The suspension was stirred for about fifteen hours. The powder was collected on a Buchner funnel (diameter of 7.5 cm) and was washed with 500 ml of 0.1M ammonium hydroxide in 60 ml portions, with the liquid level being maintained above the top of the precipitate, to avoid cracking of the filter cake. The powder was resuspended in an additional 500 ml of 0.1M ammonium hydroxide solution and was stirred for about one hour, was collected on a Buchner funnel, and was washed with 500 ml of 0.1M ammonium hydroxide in 60 ml portions. The powder was partially dried under suction on a Buchner funnel for about ten minutes. The moist emeraldine base powder was then transferred on filter paper to a desiccator and was dried under dynamic vacuum for about four hours. It was then pulverized by mortar and pestle and was dried further under dynamic vacuum for forty-eight hours at room temperature.

EXAMPLE 2

This Example illustrates the preparation of free-standing films of emeraldine base and emeraldine hydrochloride. The EB powder was dissolved in N-methylpyrrolidinone (NMP) and free standing films of EB were solution cast by the procedure described by M. Angelopoulos and coworkers, Synthetic Metals, Vol. 21, pp. 21–30 (1987) and Mol. Cryst. Liq. Cryst. 160, 151–163 (1988). Some of the EB films were subsequently doped with hydrochloric acid to yield lustrous dark blue films of emeraldine hydrochloride (ES-HCl).

A solution containing about 1 gm of emeraldine base (EB) in about 70 ml of N-methyl-pyrrolidinone (NMP) was found satisfactory for casting films. Films cast from very thick solutions (for example, about 5% EB in NMP, by weight) tend to be brittle while films made from very dilute solutions are too thin and may have pinholes. Chemically synthesized emeraldine base was ground to a fine powder, 1 gm of which was slowly added to 70 ml of NMP while being magnetically stirred. The solution was kept stirring at room temperature for about one hour after which time the intense blue solution was filtered through a Buchner funnel (Whatman #2 filter paper) using a water aspirator. No observable insoluble material remained on the filter. A Pasteur pipette was used to distribute an even layer of liquid over a piece of clean, level glass to obtain an even coating. The coated glass was dried under dynamic vacuum for about twelve hours at room temperature. The film was removed from the glass substrate by immersion in distilled water for three to five minutes after which time the film began to lift off from the glass. The EB film was first washed with distilled water (three 30 ml portions) to remove traces of NMP which is soluble in water and then with ether. To prevent the film from folding over on itself during the washing process, it was found that the use of a clean microscope slide offered greater manageability than just a pair of forceps. In order to prevent the film from curling when drying, it was placed between two pieces of release paper. This "sandwich" was wetted with ether and was placed between two pieces of glass that were held tightly together by means of a weight. The film was dried for about twelve hours under dynamic vacuum at room temperature. Flexible free-standing bronze colored films of emeraldine base, with a coppery glint on the side that adhered to the glass substrate, were obtained by the above method. The films were about 10 microns thick.

The emeraldine hydrochloride films were obtained by two methods. In the first method, the free-standing emeraldine base film was converted to emeraldine hydrochloride film by treatment with 1M hydrochloric acid for twenty-four hours. The film immediately turned dark blue, characteristic of emeraldine salts. The film was permitted to remain in contact with the hydrochloric acid for twenty-four hours to ensure complete protonation. It was then rinsed with ether (four 20 ml portions) and was dried in a similar fashion to the emeraldine base film as described above. The second method consisted of immersing the EB-coated glass, that had been dried, directly into 1M hydrochloric acid instead of water. This served two purposes: the EB was doped and converted to the salt form while simultaneously being lifted off the glass substrate. Again, the film was rinsed in ether and dried in the manner described above. Relatively flexible, dark blue, free-standing films of emeraldine hydrochloride, with a lustrous shine to the side that adhered to the glass substrate, were obtained.

EXAMPLE 3

This Example illustrates how the XPS samples were prepared by a sequential, multi-step process involving the following: machining of the XPS stub of specific geometry and dimensions; mounting of the polymer film onto the stub; deposition of iron of specific thickness over the polymer; and, finally, exposure of the iron/polymer/stub sample to different corrosive environments. A schematic of the iron/polymer/stub sample configuration is given in FIG. 1. The details of the steps used follow with the exception of the exposure of the samples to the different corrosive environments which is described in Example 4 which follows.

The XPS stub was machined from commercial grade aluminum. Its geometry and dimensions were dictated by the specifications required for operation in the VG Scientific ESCALAB MkII spectrometer. The length of the stub measured 0.571 inch with a top face of circular cross-section and a diameter of 0.395 inch. Prior to use, the stub was cleaned in isopropyl alcohol by ultrasonic agitation for three to five minutes and was dried with a heat gun.

The polymer film was cut to size and was mounted on the aluminum stub prior to iron deposition, using a dab of high purity, air drying silver paint as an adhesive (SPI Supplies, Division of Structure Probe, Inc.). The polymer film was laid over the wet silver paint which was then air dried for at least twelve hours. The polymer films that were used for sample preparation included free-standing emeraldine base and emeraldine hydrochloride films, synthesized as discussed above, commercially available polyethylene terephthalate (PET), and polyimide (PI) which is available from DuPont under the registered trademark KAPTON H. Polyethylene terephthalate and polyimide are known to be non-electroactive polymers and, hence, were used as control polymers.

Iron, in the elemental metallic state (with a purity of at least 99.999%), of varying thickness was sputter deposited onto the polymer/aluminum stub substrates as well as directly onto aluminum stubs in a Veeco MicroEtch argon ion mill. A sample holder in which the XPS stubs could be loaded was especially designed (see FIG. 1a). After loading the samples, the Veeco bell jar was pumped down to a base pressure of below $8\times10^{-6}$ torr. During operation of the argon ion beam, the pressure was maintained at $8\times10^{-5}$ torr. Prior to deposition, the iron target was argon ion etched for one to two minutes to remove surface oxides that may have formed during brief exposure to the atmosphere. The argon ion beam was then turned off and the bell jar was again pumped down to the base pressure. Following a delay of fifteen to twenty minutes to minimize oxygen contamination within the bell jar, the sample shutter was opened and iron was deposited on the polymer/aluminum stub substrate. In order to calibrate the iron deposition rate for the configuration being used in the Veeco bell jar, a thick film of iron was sputter deposited onto a glass/aluminum stub substrate. The thickness of the iron film was measured using a Dekatak IID disk surface profilometer yielding an iron deposition rate of about 5.8 Å/sec. Iron of varying thicknesses were sputter deposited onto the polymer/aluminum stub substrates by varying the deposition time. Extensive experiments were conducted on the samples for which the iron deposition times were twelve seconds and sixty seconds yielding an iron thickness of about 70 Å and about 350 Å, respectively.

EXAMPLE 4

This Example illustrates the testing and evaluation of the samples prepared as previously described.

The iron/polymer and iron/aluminum samples were tested by exposure to two kinds of environments, namely protective and corrosive. The protected environment consisted of a short exposure to laboratory air for a total of about five minutes. An accelerated corrosive environment was simulated by exposing the samples to high humidity air (relative humidity greater than 90%) in an oven maintained at 70° C. for twenty-four hours. The test samples were characterized by a surface/near-surface study using X-ray photoelectron spectroscopy (XPS) to evaluate the corrosion protection afforded by the various polymers.

The XPS spectra were recorded on a VG Scientific ESCALAB MkII spectrometer using a magnesium K$\alpha$ anode (1253.6 eV). First, the XPS spectra of the exposed samples were recorded. Depth profiling to probe the oxidation state of iron as a function of thickness, starting from the exposed outer surface and moving in toward the iron/polymer interface, was then accomplished by etching the samples in-situ using an argon ion gun at an etch rate of about 25 Å/min. All spectra were recorded at a vacuum of $5 \times 10^{-9}$ mbar or better.

Figure 2:
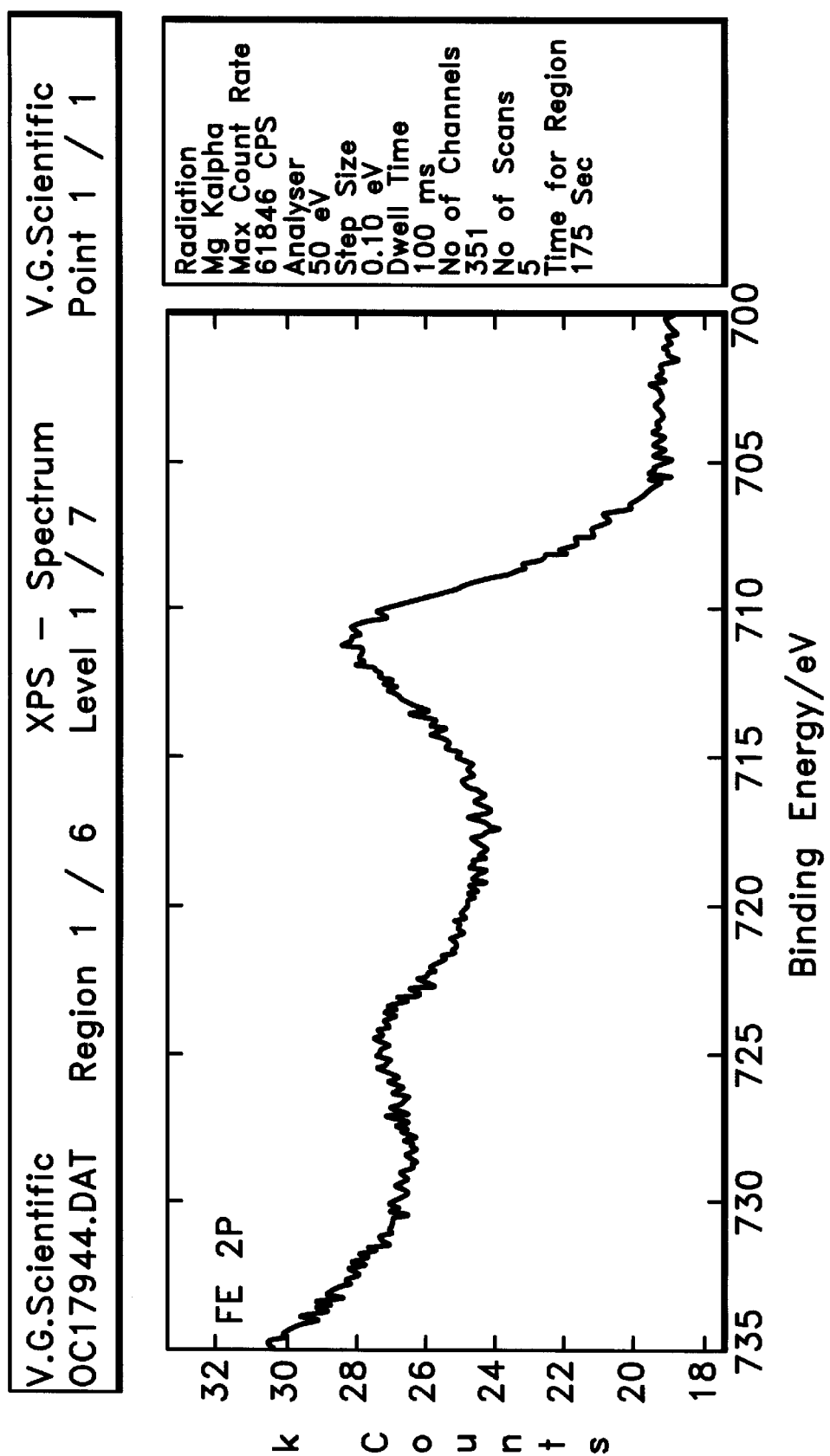
FIG. 2 is an XPS spectrum of an iron/polyaniline emeraldine base sample after exposure to laboratory air for about five minutes.

FIG. 2 shows the Fe 2p XPS spectrum of the iron(70 Å)/EB sample after exposure to laboratory air for about five minutes. Due to spin-orbit coupling the iron core level peak splits into Fe $2p_{3/2}$ and Fe $2p_{1/2}$ components, which for pure iron are at 707 eV and 720 eV, respectively. The Fe $2p_{3/2}$ peak was at 711 eV, FIG. 2, and its spectral lineshape is typical of that observed for $\alpha$-FeOOH. This was consistent with the binding energy shift observed in the Fe $2p_{1/2}$ core level from 720 eV to 724.5 eV. The Fe 2p core level peaks observed for all the iron/polymer and iron/aluminum systems studied herein were very similar to those shown in FIG. 2, indicating that iron (III) hydroxide was the primary corrosion product at the outermost surface.

The depth profiling results obtained on the 350 Å thick iron film deposited on aluminum, polyaniline, and control polymer substrates, after exposure in an oxygen/humidity chamber for twenty-four hours at 70° C., are displayed in FIG. 3. Upon etching the outer surface of the Fe(350 Å)/EB sample within the ultrahigh vacuum chamber for one minute (not shown), the metallic iron peak at 707 eV appeared as a shoulder with the hematite component at about 711 eV dominating the spectrum. After two minutes of etching, the most intense component in the Fe $2p_{3/2}$ spectrum was at 707 eV corresponding to unoxidized, metallic iron (FIG. 3b). The weak shoulder at 711 eV was associated with some iron present as $Fe_2O_3$ (hematite). This indicates that the undercoating of EB was passivating the outside iron surface with a thin (about 30–50 Å) oxide layer of mainly hematite.

Figure 3A:
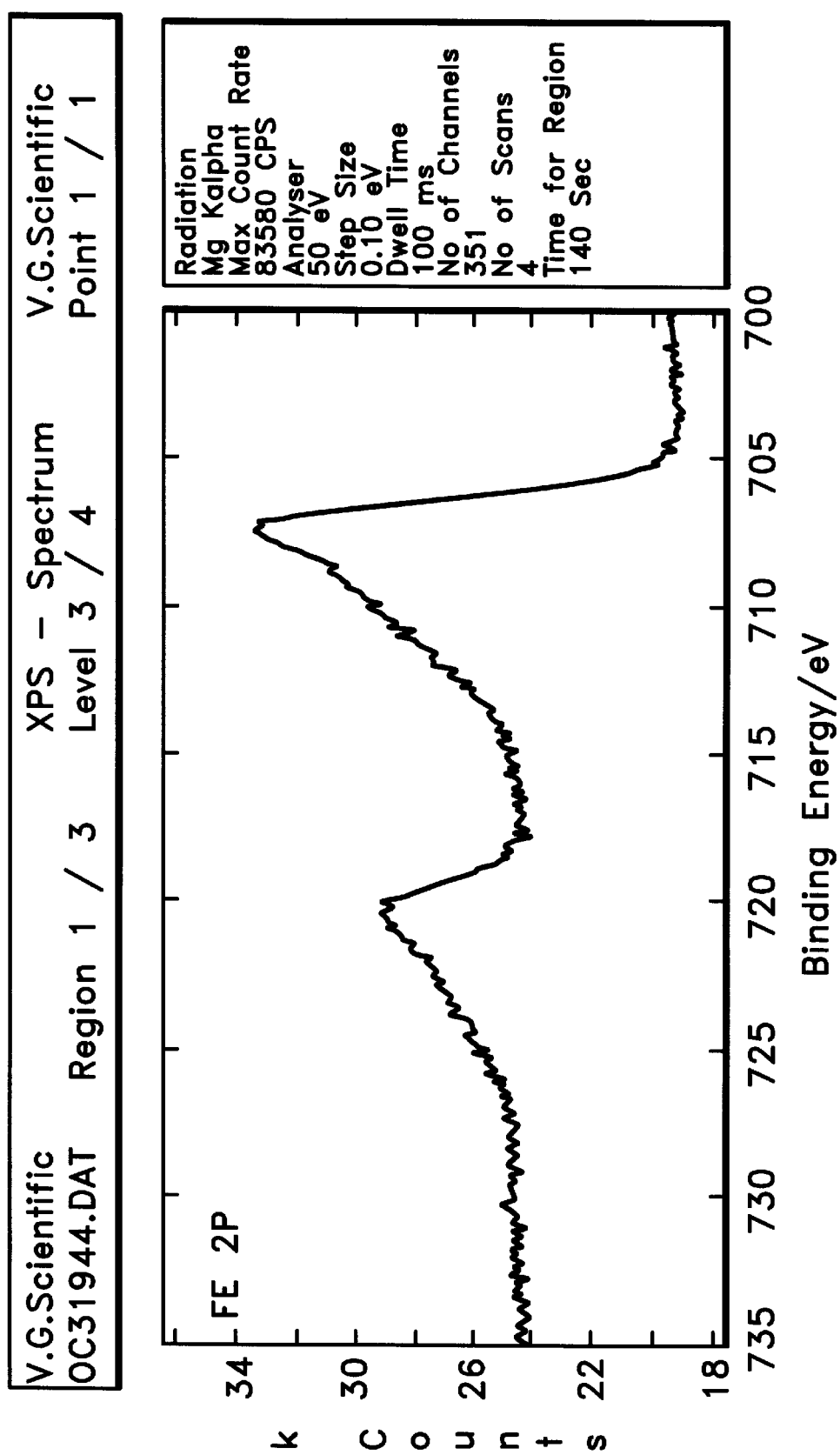
FIG. 3A is an XPS spectrum of an iron/aluminum sample after exposure to an oxygen/humidity chamber for twenty-four hours at 70° C. after two minutes of in-situ argon ion etching.
Figure 3B:
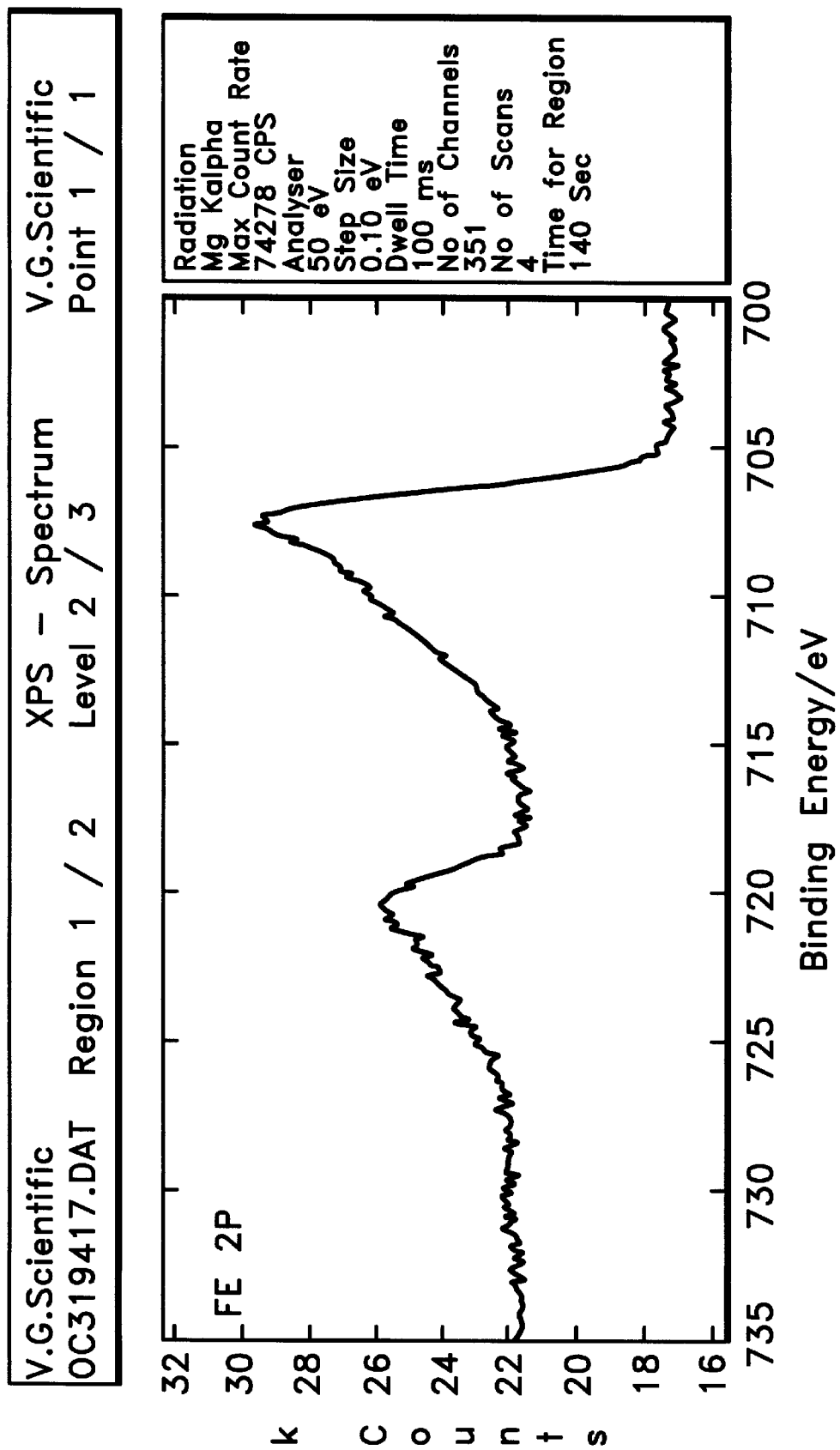
FIG. 3B is an XPS spectrum of an iron/polyaniline emeraldine base sample after exposure to an oxygen/humidity chamber for twenty-four hours at 70° C. after two minutes of in-situ argon ion etching.
Figure 3C:
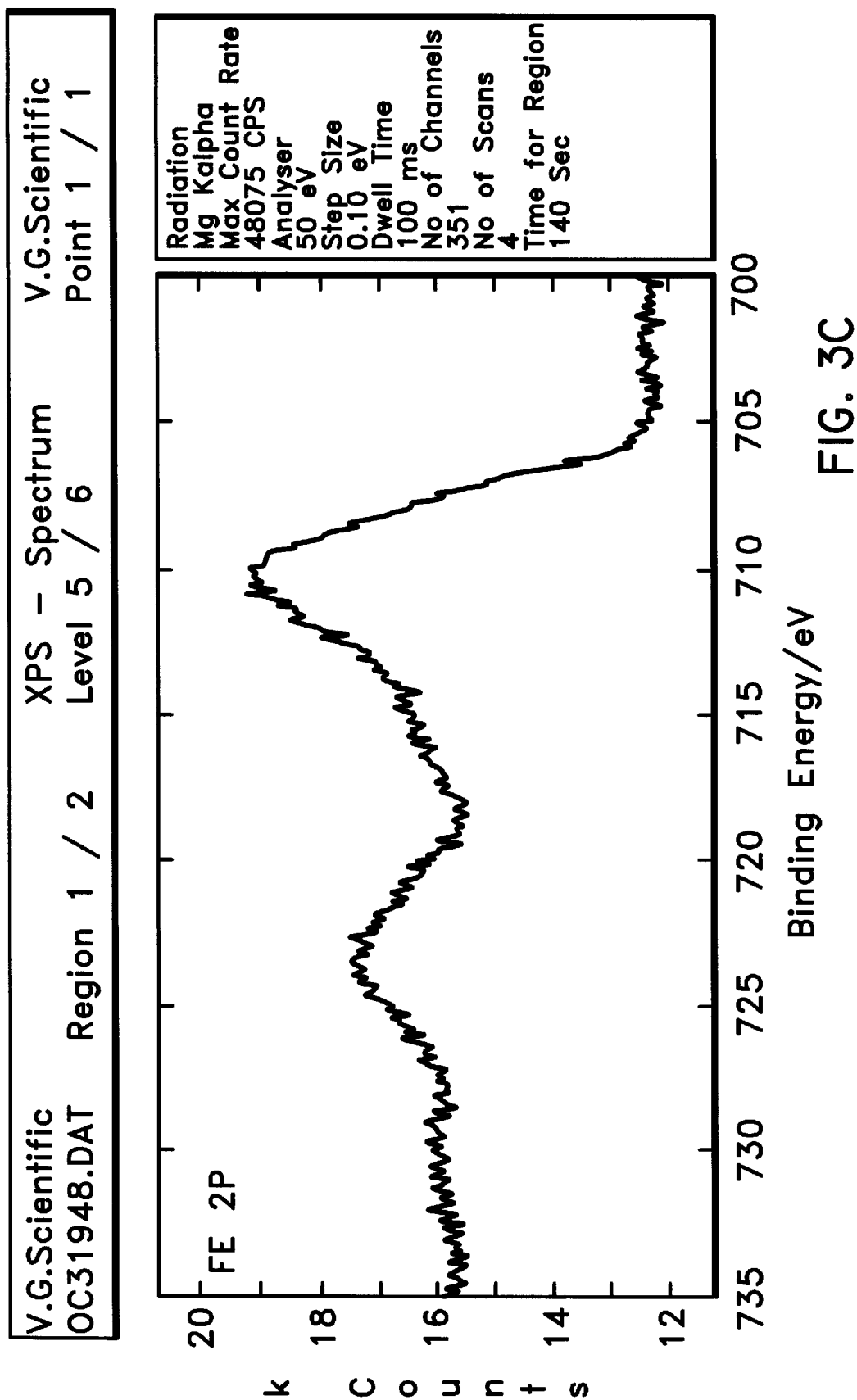
FIG. 3C is an XPS spectrum of an iron/polyaniline emeraldine hydrochloride sample after exposure to an oxygen/humidity chamber for twenty-four hours at 70° C. after seven minutes of in-situ argon ion etching.
Figure 3D:
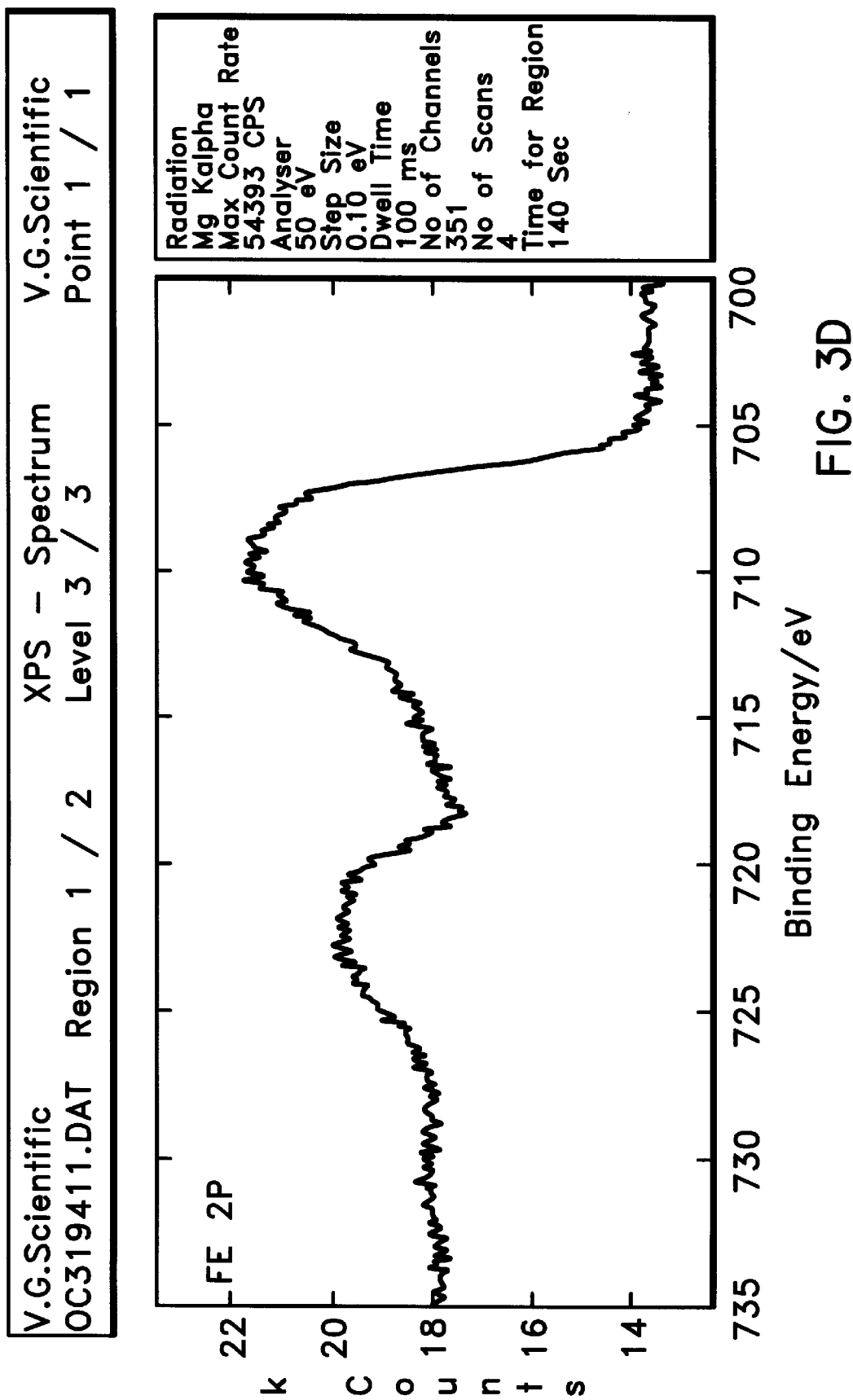
FIG. 3D is an XPS spectrum of an iron/polyethylene terephthalate sample after exposure to an oxygen/humidity chamber for twenty-four hours at 70° C. after seven minutes of in-situ argon ion etching.
Figure 3E:
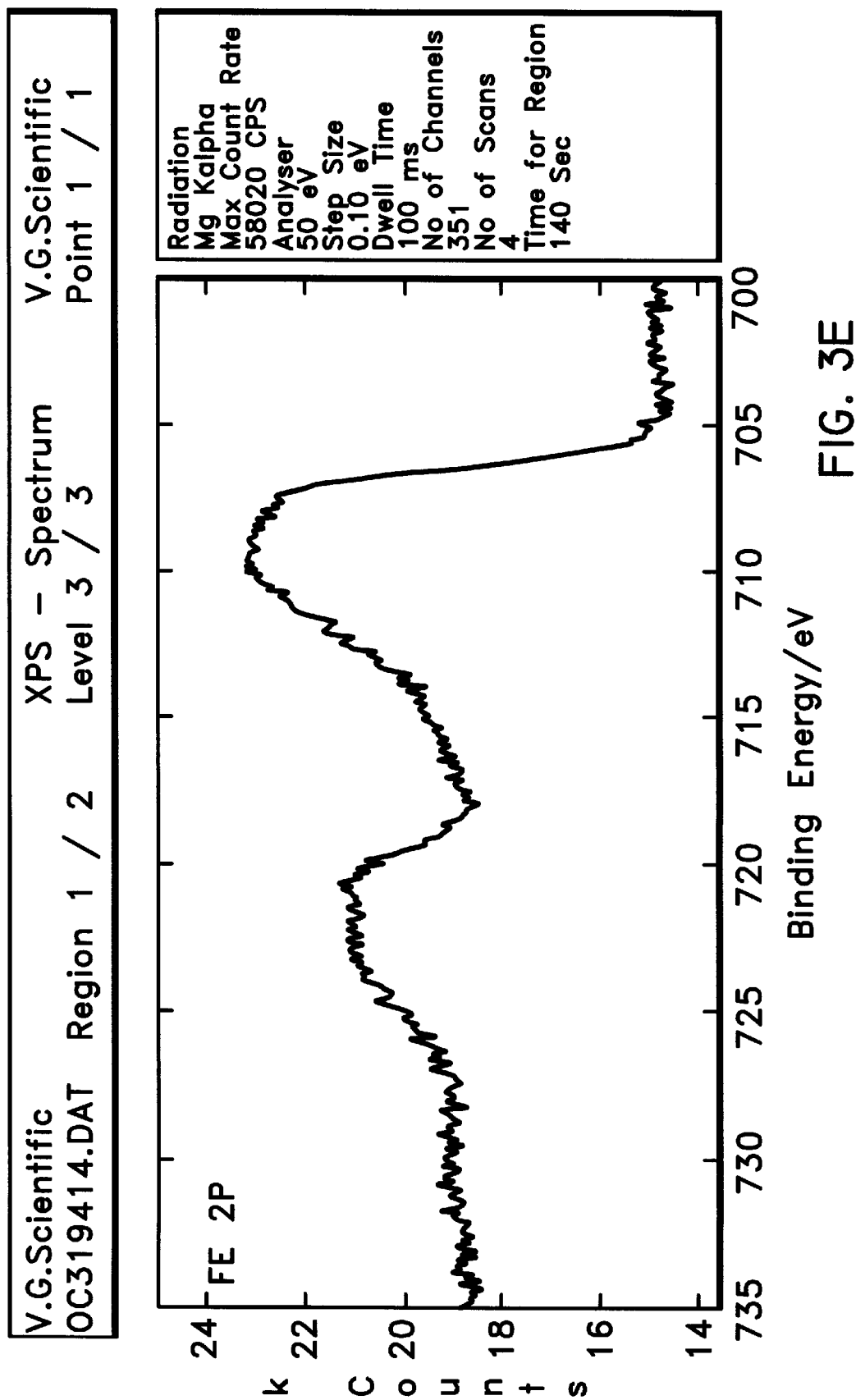
FIG. 3E is an XPS spectrum of an iron/polyimide sample after exposure to an oxygen/humidity chamber for twenty-four hours at 70° C. after seven minutes of in-situ argon ion etching.

The results for iron on EB are similar to those for the iron(350 Å)/aluminum sample (FIG. 3a). Iron/aluminum forms a galvanic couple, with aluminum being the active metal and providing cathodic protection to iron in a manner similar to zinc as described by H. H. Uhlig, Corrosion and Corrosion Control, p. 296 (John Wiley & Sons Publishers, New York, 1963). The resemblance between FIGS. 3a and 3b shows that in these studies the corrosion protection afforded by EB was comparable to that obtained by galvanically coupling iron to aluminum. In contrast, for the iron (350 Å)/ES-HCl sample, the Fe $2p_{3/2}$ spectrum, recorded after seven minutes of etching (FIG. 3c), had a weak shoulder at 707 eV corresponding to elemental iron metal, but the main peak, centered about 710 eV consisted of several components that are associated with the various oxidation states of iron. This indicates that, in these studies, ES-HCl was much less effective in passivating the outer surface of iron with a thin hermetically sealing oxide layer. The Fe 2p spectra recorded after etching the control samples, iron(350 Å)/PET and iron(350 Å)/PI, for seven minutes, showed broad peaks centered at 710 eV and 722 eV as shown in FIGS. 3d and 3e. The width of the peaks reveals that a distribution of iron oxidation states is present in both samples as deep as about 175 Å into the thickness of the iron layer. The inability of the non-electroactive control polymers, PET and PI, to passivate the outer surface of iron indicates that the mechanism for the passivation of iron by EB has an electronic origin. The electronic origin of this effect is supported by shifts in corrosion potential for EB/cold rolled steel (CRS) from the bare CRS value.

The results of the XPS studies on 350 Å and 70 Å thick iron samples, subjected to corrosive as well as relatively protected environments, indicate that the neutral emeraldine base form of polyaniline passivates all surfaces of iron that are exposed to the environment with a thin oxide layer consisting mainly of hematite. EB does not need to be coated on the external surface of iron to provide corrosion protection via passivation; an undercoat was effective. The mechanism for passivation appears to have an electronic origin. The doped polyaniline, emeraldine hydrochloride, on the other hand, does not provide effective corrosion protection for iron in these studies.

The foregoing Examples should not be construed in a limiting sense since they are intended to merely illustrate certain embodiments of the present invention. The scope of protection sought is set forth in the Claims which follow.

We claim:

1. A corrosion resistant metal article which comprises:
   (a) a metal body normally prone to corrosion when subjected to potentially corrosive conditions; and
   (b) a coating of neutral, undoped polyaniline in the emeraldine base form on a portion of the metal body, where the distance between coated and uncoated portions of the metal is effective to protect the uncoated portion of the metal as well as the coated portion of the metal.

2. A corrosion resistant metal article as claimed in claim 1 wherein the coating is a side coating in relationship to the uncoated portion of the metal which is to be protected from corrosion.

3. A metal article as claimed in claim 1 wherein the distance is not more than about one centimeter.

4. A metal article as claimed in claim 2 wherein the distance is not more than about one centimeter.

5. A metal article as claimed in claim 1 wherein the metal body comprises ferrous metal.

6. A metal article as claimed in claim 1 wherein the metal body comprises a compound metal.

7. A metal article as claimed in claim 1 wherein the metal body comprises ferrous metal and has a thickness of from about 10 Angstroms to about one centimeter.

8. A metal article as claimed in claim 1 wherein the metal body comprises a compound metal and has a thickness of from about 10 Angstroms to about one centimeter.

9. A metal article as claimed in claim 2 wherein the metal body comprises ferrous metal.

10. A metal article as claimed in claim 2 wherein the metal body comprises a compound metal.

11. A metal article as claimed in claim 2 wherein the metal body comprises ferrous metal and has a thickness of from about 10 Angstroms to about one centimeter.

12. A metal article as claimed in claim 2 wherein the metal body comprises a compound metal and has a thickness of from about 10 Angstroms to about one centimeter.

* * * * *